US010270433B1

(12) United States Patent
Venugopal

(10) Patent No.: US 10,270,433 B1
(45) Date of Patent: Apr. 23, 2019

(54) MASTER-SLAVE CLOCK GENERATION CIRCUIT

(71) Applicant: Apple Inc., Cupertino, CA (US)

(72) Inventor: Vivekanandan Venugopal, San Jose, CA (US)

(73) Assignee: Apple Inc., Cupertino, CA (US)

( * ) Notice: Subject to any disclaimer, the term of this patent is extended or adjusted under 35 U.S.C. 154(b) by 0 days.

(21) Appl. No.: 15/939,156

(22) Filed: Mar. 28, 2018

(51) Int. Cl.

| | |
|---|---|
| ***G06F 1/04*** | (2006.01) |
| ***H03K 3/3562*** | (2006.01) |
| ***H03K 19/096*** | (2006.01) |
| ***H03K 3/3568*** | (2006.01) |
| *G01R 31/317* | (2006.01) |

(52) U.S. Cl.
CPC ....... *H03K 3/35625* (2013.01); *H03K 3/3568* (2013.01); *H03K 19/0963* (2013.01); *G01R 31/31725* (2013.01)

(58) Field of Classification Search
CPC ..... G06F 1/04; G06F 1/06; G06F 1/08; G06F 1/10; H03K 5/131; H03K 5/132; G01R 31/31922; H04L 7/0008
See application file for complete search history.

(56) References Cited

U.S. PATENT DOCUMENTS 6,518,808 B2 * 2/2003 Shimoda ................ H03K 5/135 327/108
7,772,889 B2 8/2010 Naffziger
7,825,689 B1 11/2010 Vasishta et al.
9,612,281 B2 4/2017 Lou et al.
2007/0241800 A1 * 10/2007 Pollock .................. H03K 5/133 327/276
2014/0167826 A1 * 6/2014 Kitagawa ............... H03K 5/131 327/158

* cited by examiner

*Primary Examiner* — Long Nguyen
(74) *Attorney, Agent, or Firm* — Meyertons, Hood, Kivlin, Kowert & Goetzel, P.C.

(57) ABSTRACT

In various embodiments, a master-slave clock generation circuit may include a first delay circuit, a second delay circuit, a first tristate inverter, and a second tristate inverter. The first delay circuit may delay a clock signal and output a slave clock signal and a delayed clock signal. The first tristate inverter may selectively invert the clock signal based on a scan enable signal. The second tristate inverter may selectively invert the delayed clock signal based on the scan enable signal. The second delay circuit may delay a signal received from the first tristate inverter, the second tristate inverter, or both, and output a master clock signal. As a result, the master-slave clock generation circuit may be configured to output a master clock signal and a slave clock signal having differing sets of relative timing characteristics depending on whether the scan enable signal is asserted.

20 Claims, 6 Drawing Sheets

MASTER-SLAVE CLOCK GENERATION CIRCUIT

BACKGROUND

Technical Field

This disclosure relates generally to a master-slave clock generation circuit.

Description of the Related Art

Integrated circuits utilizing digital logic may include a number of circuits whose operation is synchronized to a clock signal. The types of circuits that operate according to a clock signal include flip-flops, various types of memory, counters, and so on.

As integrated circuits have become denser, clock signals have become faster (i.e., higher frequency). Furthermore, sequential circuits typically have timing budgets, which is an allotted amount of time in which to complete operations when a received clock signal is in a certain state. Different circuits may have different timing constraints within a system. As a result, in some systems, multiple clock signals may be used. Further, in different modes, additional time constraints may occur. For example, some signals may be delayed when a circuit is in a testing mode.

SUMMARY

In various embodiments, a master-slave clock generation circuit is disclosed where a first tristate inverter generates a master signal based on a clock signal when a scan enable signal is asserted and a second tristate inverter generates the master signal based on a delayed version of the clock signal when the scan enable signal is deasserted. The clock signal may be used to generate a slave clock signal and the master signal may be used to generate a master clock signal. The master clock signal and the slave clock signal may cause data to be passed to respective portions of a master-slave flip-flop. Accordingly, the master clock signal may have a different timing with respect to the slave clock signal based on the scan enable signal. As a result, a hold time of a scan input to the master-slave flip-flop may be reduced, which, in some cases, may reduce or eliminate a need to hold a value of the scan input, as compared to a system where the master clock signal has a fixed timing with respect to the slave clock signal. Further, in some cases, because the need to hold the value of the scan input may be reduced or eliminated, a power consumption of the master-slave flip-flop, an area of the master-slave flip-flop, or both may be reduced. Additionally, the master-slave clock generation circuit may have fewer transistors connected to the clock signal, as compared to a system where separate data and scan clocks are used.

Figure 1:
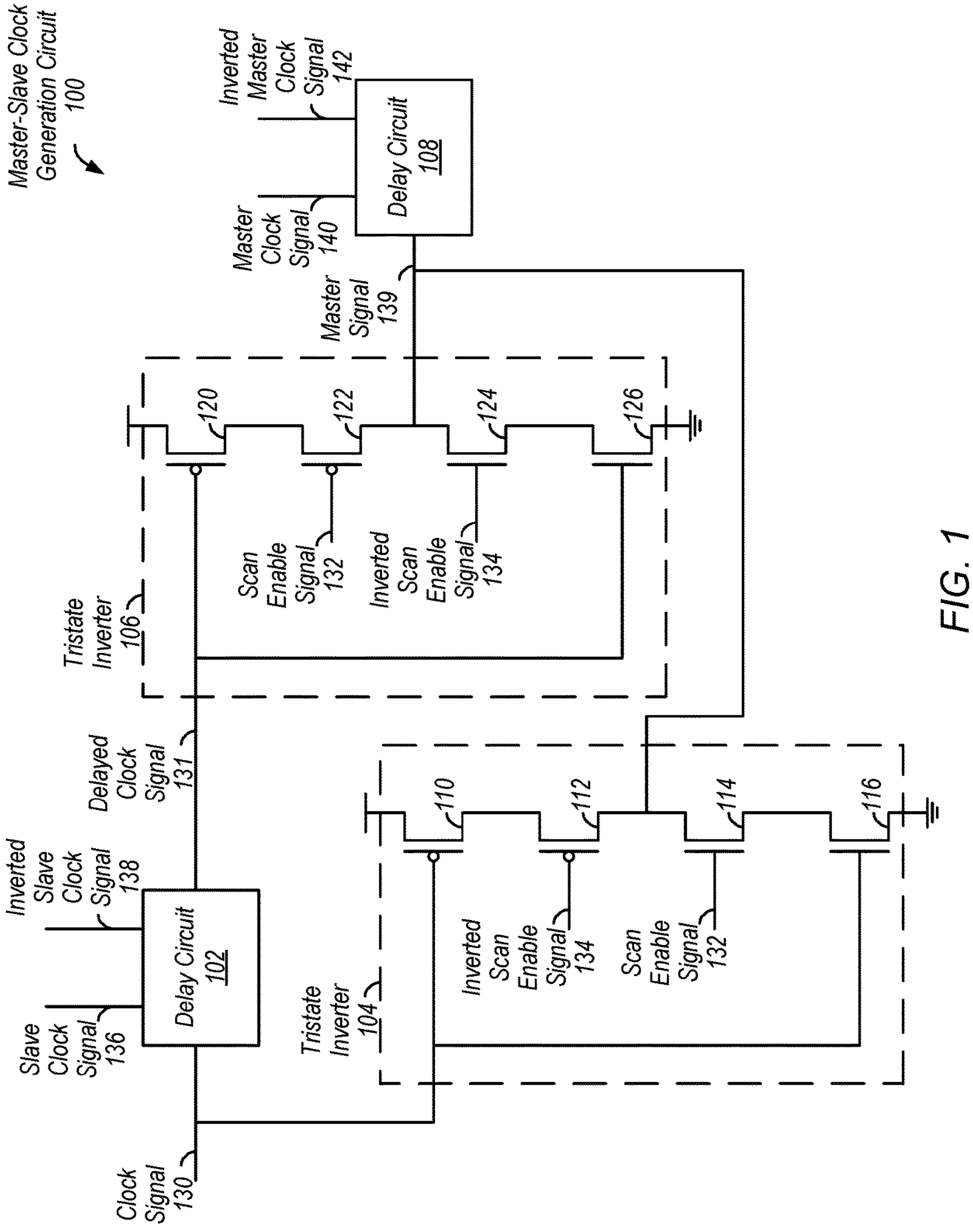
FIG. 1 is a block diagram illustrating one exemplary embodiment of a master-slave clock generation circuit.

Although the embodiments disclosed herein are susceptible to various modifications and alternative forms, specific embodiments are shown by way of example in the drawings and are described herein in detail. It should be understood, however, that drawings and detailed description thereto are not intended to limit the scope of the claims to the particular forms disclosed. On the contrary, this application is intended to cover all modifications, equivalents and alternatives falling within the spirit and scope of the disclosure of the present application as defined by the appended claims.

This disclosure includes references to “one embodiment,” “a particular embodiment,” “some embodiments,” “various embodiments,” or “an embodiment.” The appearances of the phrases “in one embodiment,” “in a particular embodiment,” “in some embodiments,” “in various embodiments,” or “in an embodiment” do not necessarily refer to the same embodiment. Particular features, structures, or characteristics may be combined in any suitable manner consistent with this disclosure.

Within this disclosure, different entities (which may variously be referred to as “units,” “circuits,” other components, etc.) may be described or claimed as “configured” to perform one or more tasks or operations. This formulation [entity] configured to [perform one or more tasks] is used herein to refer to structure (i.e., something physical, such as an electronic circuit). More specifically, this formulation is used to indicate that this structure is arranged to perform the one or more tasks during operation. A structure can be said to be “configured to” perform some task even if the structure is not currently, being operated. A. “memory device configured to store data” is intended to cover, for example, an integrated circuit that has circuitry that performs this function during operation, even if the integrated circuit in question is not currently being used (e.g., a power supply is not connected to it). Thus, an entity described or recited as “configured to” perform some task refers to something physical, such as a device, circuit, memory storing program instructions executable to implement the task, etc. This phrase is not used herein to refer to something intangible.

The term “configured to” is not intended to mean “configurable to.” An unprogrammed FPGA, for example, would not be considered to be “configured to” perform some specific function, although it may be “configurable to” perform that function after programming.

Reciting in the appended claims that a structure is “configured to” perform one or more tasks is expressly intended not to invoke 35 U.S.C. § 112(f) for that claim element. Accordingly, none of the claims in this application as filed are intended to be interpreted as having means-plus-function elements. Should Applicant wish to invoke Section 112(f) during prosecution, it will recite claim elements using the “means for” [performing a function] construct.

As used herein, the term “based on” is used to describe one or more factors that affect a determination. This term does not foreclose the possibility that additional factors may affect the determination. That is, a determination may be solely based on specified factors or based on the specified factors as well as other, unspecified factors. Consider the phrase “determine A based on B.” This phrase specifies that B is a factor that is used to determine A or that affects the determination of A. This phrase does not foreclose that the determination of A may also be based on some other factor, such as C. This phrase is also intended to cover an embodiment in which A is determined based solely on B. As used herein, the phrase "based on" is synonymous with the phrase "based at least in part on."

As used herein, the phrase "in response to" describes one or more factors that trigger an effect. This phrase does not foreclose the possibility that additional factors may affect or otherwise trigger the effect. That is, an effect may be solely in response to those factors, or may be in response to the specified factors as well as other, unspecified factors. Consider the phrase "perform A in response to B." This phrase specifies that B is a factor that triggers the performance of A. This phrase does not foreclose that performing A may also be in response to some other factor, such as C. This phrase is also intended to cover an embodiment in which A is performed solely in response to B.

As used herein, the terms "first," "second," etc. are used as labels for nouns that they precede, and do not imply any type of ordering (e.g., spatial, temporal, logical, etc.), unless stated otherwise. For example, in a processing circuit that includes three flip-flops, the terms "first flip-flop" and "second flip-flops" can be used to refer to any two of the three flip-flops, and not, for example, just logical flip-flops 0 and 1.

When used in the claims, the term "or" is used as an inclusive or and not as an exclusive or. For example, the phrase "at least one of x, y, or z" means any one of x, y, and z, as well as any combination thereof (e.g., x and y, but not z).

In the following description, numerous specific details are set forth to provide a thorough understanding of the disclosed embodiments. One having ordinary skill in the art, however, should recognize that aspects of disclosed embodiments might be practiced without these specific details. In some instances, well-known circuits, structures, signals, computer program instruction, and techniques have not been shown in detail to avoid obscuring the disclosed embodiments.

DETAILED DESCRIPTION

Some master-slave flip-flop circuits may have different timing constraints for data inputs, as compared to scan inputs. As a result, if a same clock generation circuit (e.g., a delay chain of inverters) is used to generate clock signals for both the data input and the scan input, an input value (e.g., the scan input) may be stored in a hold buffer to avoid a potential timing error. However, the hold buffer may consume an undesirable amount of energy and area. Further, the flip-flop circuits may be transparent during a scan shift mode.

A master-slave clock generation circuit is described herein where a slave clock signal may be generated based on a clock signal. The master clock signal may be generated based on an output of two tristate inverters that are activated based on a scan enable signal, where a first tristate inverter generates an output based on the clock signal and the second tristate inverter generates an output based on a delayed version of the clock signal. As a result, the master clock signal may have a different timing based on whether the scan enable signal is asserted. Further, the master clock signal and the slave clock signal may be generated based on a single clock signal.

As used herein, "asserted" refers to an active state of a signal. For example, a logically high signal being sent to an active-high circuit would be considered "asserted." Similarly, a logically low signal being sent to an active-low circuit would be considered "asserted." In contrast, "deasserted" refers to an inactive state of the signal. For example, a logically low signal being sent to an active-high circuit would be considered "deasserted."

As used herein, a "ground voltage" refers to a logical low voltage provided to a circuit. Although the ground voltage may, in some cases, refer to a voltage of 0 volts, in other cases, the ground voltage does not refer to a voltage of 0 volts.

Turning now to FIG. 1, a simplified block diagram illustrating one embodiment of a master-slave clock generation circuit 100 is shown. In the illustrated embodiment, master-slave clock generation circuit 100 includes delay circuit 102, tristate inverter 104, tristate inverter 106, and delay circuit 108. In the illustrated embodiment, tristate inverter 104 includes transistors 110-116 and tristate inverter 106 includes transistors 120-126. Although a particular arrangement of devices is illustrated in FIG. 1, in other embodiments, other arrangements may be used. For example, in some embodiments, transistors 120 and 122 may be switched such that transistor 120 is connected to the voltage source through transistor 122. Additionally, although a specific type of device, metal-oxide-semiconductor field-effect transistors (MOSFETs) are illustrated, in other embodiments, other devices (e.g., bipolar junction transistors (BJTs) may be used.

Delay circuit 102 may generate, based on clock signal 130, slave clock signal 136, inverted slave clock signal 138, and delayed clock signal 131. In particular, in various embodiments, delay circuit 102 may include a plurality of inverters configured to invert clock signal 130 a corresponding number of times, generating a delayed version of clock signal 130. For example, in some embodiments, delay circuit 102 may include two serially connected inverters, where slave clock signal 136 is directly connected to clock signal 130, inverted slave clock signal 138 is connected to an output of a first of the two inverters and an input of the second inverter, and delayed clock signal 131 is connected to an output of the second inverter. As another example, slave clock signal 136 may be connected to the output of the second inverter. In other embodiments, delay circuit 102 may include additional inverters, and thus may delay clock signal 130 by additional time to generate delayed clock signal 131. In various embodiments, delay circuit 102 may include an even number of inverters. Additionally, although slave clock signal 136, inverted slave clock signal 138, and delayed clock signal 131 are illustrated separately, in some embodiments, slave clock signal 136 may be the same signal as delayed clock signal 131. Additionally, in some embodiments, as further discussed with reference to FIG. 3, delay circuit 102 may output multiple versions of slave clock signal 136 and inverted slave clock signal 138, which may be delayed by a same amount of time or different amounts of time.

Tristate inverter 104 may generate at least a portion of master signal 139 based on clock signal 130, scan enable signal 132, and inverted scan enable signal 134. In particular, in the illustrated embodiment, tristate inverter 104 includes, in order, p-channel metal-oxide-semiconductor (PMOS) transistors 110 and 112 and n-channel metal-oxide-semiconductor (NMOS) transistors 114 and 116 connected between a voltage source and ground. Master signal 139 may be output at a node between transistors 112 and 114. Transistors 110 and 116 may receive clock signal 130. Transistor 114 may receive scan enable signal 132, which may indicate whether master-slave clock generation circuit

100 is in a scan mode (when scan enable signal 132 is asserted) or a function mode (when scan enable signal 132 is deasserted). Transistor 112 may receive inverted scan enable signal 134, an inverted version of scan enable signal 132. As a result, when scan enable signal 132 is asserted (and inverted scan enable signal is deasserted), tristate inverter 104 may output an inverted version of clock signal 130 as master signal 139. When scan enable signal 132 is deasserted (and inverted scan enable signal is asserted), tristate inverter 104 may not output the inverted version of clock signal 130 as master signal 139.

Tristate inverter 106 may generate at least a portion of master signal 139 based on delayed clock signal 131, scan enable signal 132, and inverted scan enable signal 134. In particular, in the illustrated embodiment, tristate inverter 106 includes, in order, PMOS transistors 120 and 122 and NMOS transistors 124 and 126 connected between a voltage source and ground. Master signal 139 may be output at a node between transistors 122 and 124. Transistors 120 and 126 may receive delayed clock signal 131. Transistor 124 may receive inverted scan enable signal 134. Transistor 122 may receive scan enable signal 132. As a result, when scan enable signal 132 is deasserted (and inverted scan enable signal is asserted), tristate inverter 106 may output an inverted version of delayed clock signal 131 as master signal 139. When scan enable signal 132 is asserted (and inverted scan enable signal is deasserted), tristate inverter 106 may not output the inverted version of delayed clock signal 131 as master signal 139. Accordingly, depending on whether scan enable signal 132 is asserted, clock signal 130 or delayed clock signal 131 may be used to generate master clock signal 140 and inverted master clock signal 142.

Delay circuit 108 may generate, based on master signal 139, master clock signal 140 and inverted master clock signal 142. In particular, in various embodiments, delay circuit 108 may include one or more inverters configured to invert master signal 139 a corresponding number of times, generating a delayed version of master signal 139. For example, in some embodiments, delay circuit 102 may include one inverter, where inverted master clock signal 142 is directly connected to master signal 139, and master clock signal 140 is connected to an output the inverter. As another example, delay circuit 108 may include three inverters connected serially (e.g., to reduce a fan-out of master signal 139), inverted master clock signal 142 may be connected to the output of the second inverter, and master clock signal 140 may be connected to an output of the third inverter. In other embodiments, delay circuit 108 may include additional inverters, and thus may master signal 139 by additional time to generate master clock signal 140 and inverted master clock signal 142. In various embodiments, delay circuit 108 may include an odd number of inverters. However, in other embodiments, delay circuit 108 may include an even number of inverters. Additionally, in some embodiments, as further discussed with reference to FIG. 3, delay circuit 108 may output multiple versions of master clock signal 140 and inverted master clock signal 142, which may be delayed by a same amount of time or different amounts of time.

Figure 2:
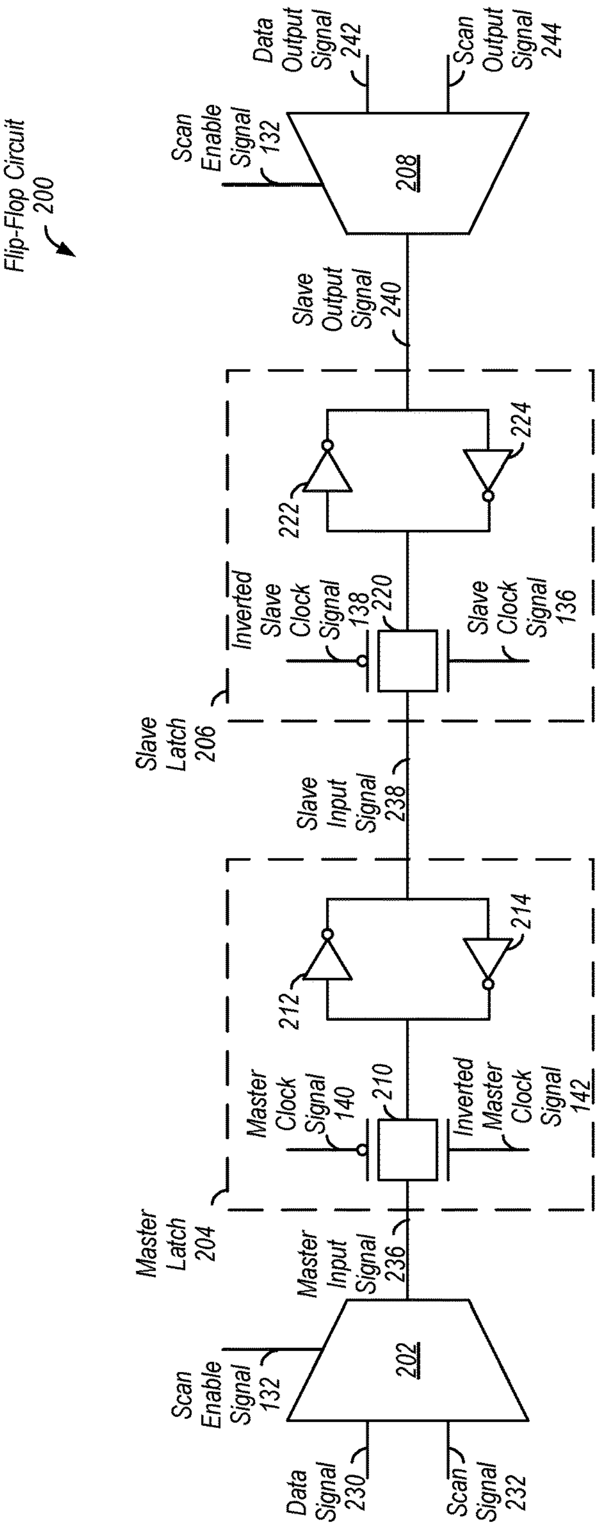
FIG. 2 is a block diagram illustrating one embodiment of an exemplary flip-flop circuit connected to a master-slave clock generation circuit.

Turning now to FIG. 2, a simplified block diagram illustrating one embodiment of an exemplary flip-flop circuit 200 connected to master-slave clock generation circuit 100 of FIG. 1 is shown. In the illustrated embodiment, flip-flop circuit 200 includes selection circuit 202, master latch 204, slave latch 206, and routing circuit 208. In the illustrated embodiment, master latch 204 includes transmission gate 210 and inverters 212 and 214. In the illustrated embodiment, slave latch 206 includes transmission gate 220 and inverters 222 and 224. In other embodiments, additional circuitry or less circuitry may be used. For example, in some embodiments, pass transistors may be used in place of transmission gates 210 and 220. Additionally, in some embodiments, routing circuit 208 may not be used (e.g., flip-flop circuit 200 may have a single output). Further, in some embodiments, various circuitry may be arranged differently. For example, master clock signal 140 may be switched with inverted master clock signal 142.

Master latch 204 may store master input signal 236 based on master clock signal 140 and inverted master clock signal 142. In particular, in the illustrated embodiment, when master clock signal 140 is deasserted (and inverted master clock signal 142 is asserted), transmission gate 210 may provide master input signal 236 to inverters 212 and 214, where master input signal 236 may be stored. Additionally, an output of inverter 212 may be output from master latch 204 as slave input signal 238. In the illustrated embodiment, when master clock signal 140 is asserted (and inverted master clock signal 142 is deasserted), transmission gate 210 may separate inverters 212 and 214 from master input signal 236. In some embodiments, inverter 212, inverter 214, or both may be a different type of circuit such as a tristate inverter. For example, inverter 214 may invert an output of inverter 212 based on master clock signal 140, inverted master clock signal 142, or both.

Slave latch 206 may store slave input signal 238 based on slave clock signal 136 and inverted slave clock signal 138. In the illustrated embodiment, slave latch 206 is configured to trigger on a different clock edge than master latch 204. In particular, in the illustrated embodiment, when slave clock signal 136 is asserted (and inverted slave clock signal 138 is deasserted), transmission gate 220 may provide slave input signal 238 to inverters 222 and 224, where slave input signal 238 may be stored. Additionally, an output of inverter 222 may be output from slave latch 206 as slave output signal 240. In the illustrated embodiment, when slave clock signal 136 is deasserted (and inverted slave clock signal 138 is asserted), transmission gate 220 may separate inverters 222 and 224 from slave input signal 238. In some embodiments, inverter 222, inverter 224, or both may be a different type of circuit such as a tristate inverter. For example, inverter 224 may invert an output of inverter 222 based on slave clock signal 136, inverted slave clock signal 138, or both.

Selection circuit 202 (e.g., a multiplexer) and routing circuit 208 (e.g., a demultiplexer) may connect master latch 204 and slave latch 206 to corresponding input and output lines based on whether flip-flop circuit 200 is in a function mode or a scan mode. In particular, in response to scan enable signal 132 indicating a function mode, selection circuit 202 may output data signal 230 as master input signal 236. Further, in response to scan enable signal 132 indicating the function mode, routing circuit 208 may output slave output signal 240 as data output signal 242. Conversely, in response to scan enable signal 132 indicating a scan mode, selection circuit 202 may output scan signal 232 as master input signal 236 and routing circuit 208 may output slave output signal 240 as scan output signal 244. Accordingly, master latch 204 and slave latch 206 may be used when flip-flop circuit 200 is in the scan mode or in the function mode.

Figure 3:
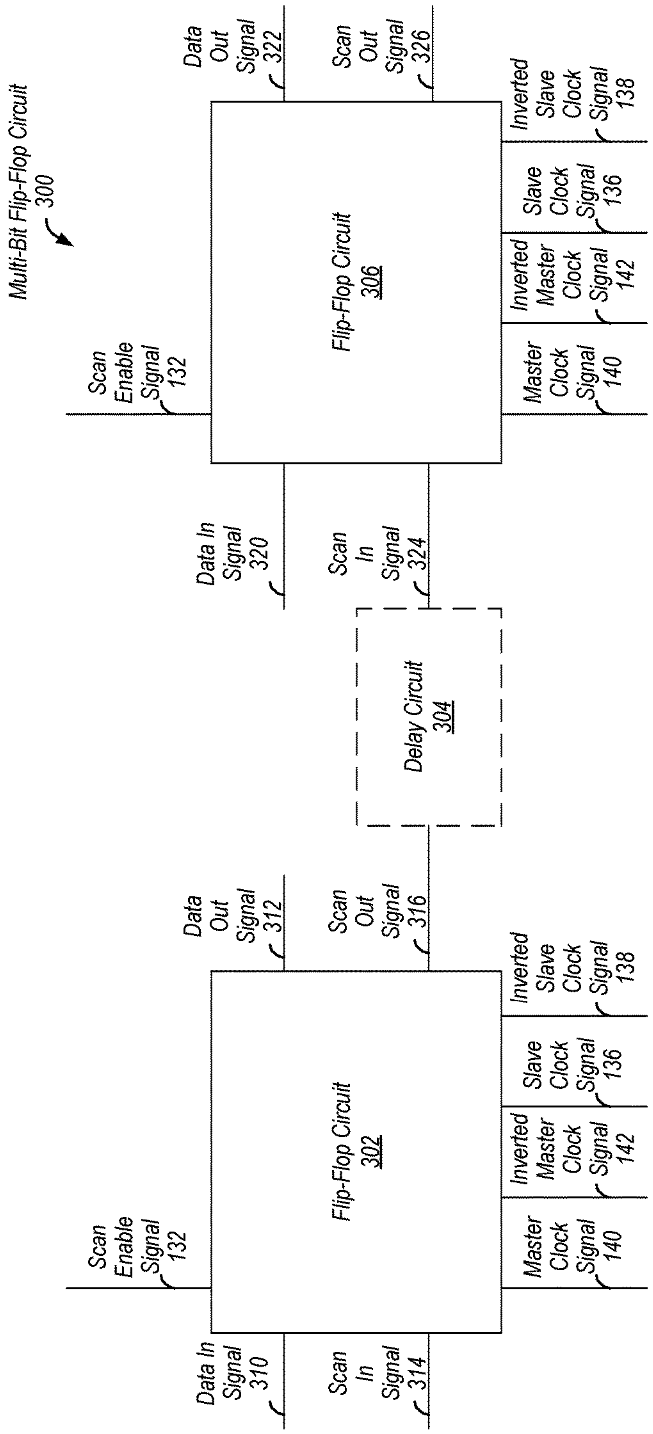
FIG. 3 is a block diagram illustrating one embodiment of an exemplary multi-bit flip-flop circuit connected to a master-slave clock generation circuit.

Turning now to FIG. 3, a simplified block diagram illustrating one embodiment of an exemplary multi-bit flip-flop circuit 300 connected to master-slave clock generation circuit 100 of FIG. 1 is shown. In the illustrated embodiment, multi-bit flip-flop circuit 300 includes flip-flop circuit 302, delay circuit 304, and flip-flop circuit 306. Although a particular arrangement of signals is illustrated, in other embodiments, other routings may be used. For example, in some embodiments, master clock signal 140 may be provided to flip-flop circuit 302 and provided from flip-flop circuit 302 to flip-flop circuit 306.

Flip-flop circuits 302 and 306 may function similarly to flip-flop circuit 200 of FIG. 2. For example, data in signal 310 may correspond to data signal 230, scan in signal 314 may correspond to scan signal 232, data out signal 312 may correspond to data output signal 242, and scan out signal 316 may correspond to scan output signal 244. Similarly, data in signal 320 may correspond to data signal 230, scan in signal 324 may correspond to scan signal 232, data out signal 322 may correspond to data output signal 242, and scan out signal 326 may correspond to scan output signal 244. Additionally, in the illustrated embodiment, flip-flop circuits 302 and 306 may receive scan enable signal 132, master clock signal 140, inverted master clock signal 142, slave clock signal 136, and inverted slave clock signal 138. In some embodiments, various signals provided to flip-flop circuit 302 may be delayed versions of signals provided to flip-flop circuit 306 or vice versa. For example, in some embodiments, slave clock signal 136 sent to flip-flop circuit 306 may be directly connected to clock signal 130 of FIG. 1 and slave clock signal 136 sent to flip-flop circuit 302 may be connected to a second inverter in an inverter chain connected to clock signal 130.

In the illustrated embodiment, scan out signal 316 may be provided to flip-flop circuit 306 as scan in signal 324. In some embodiments, delay circuit 304 may delay scan out signal 316 by a particular amount of time (e.g., using a scan chain of inverters). In other embodiments, scan out signal 316 may be sent directly to flip-flop circuit 306 as scan in signal 324.

Figure 4:
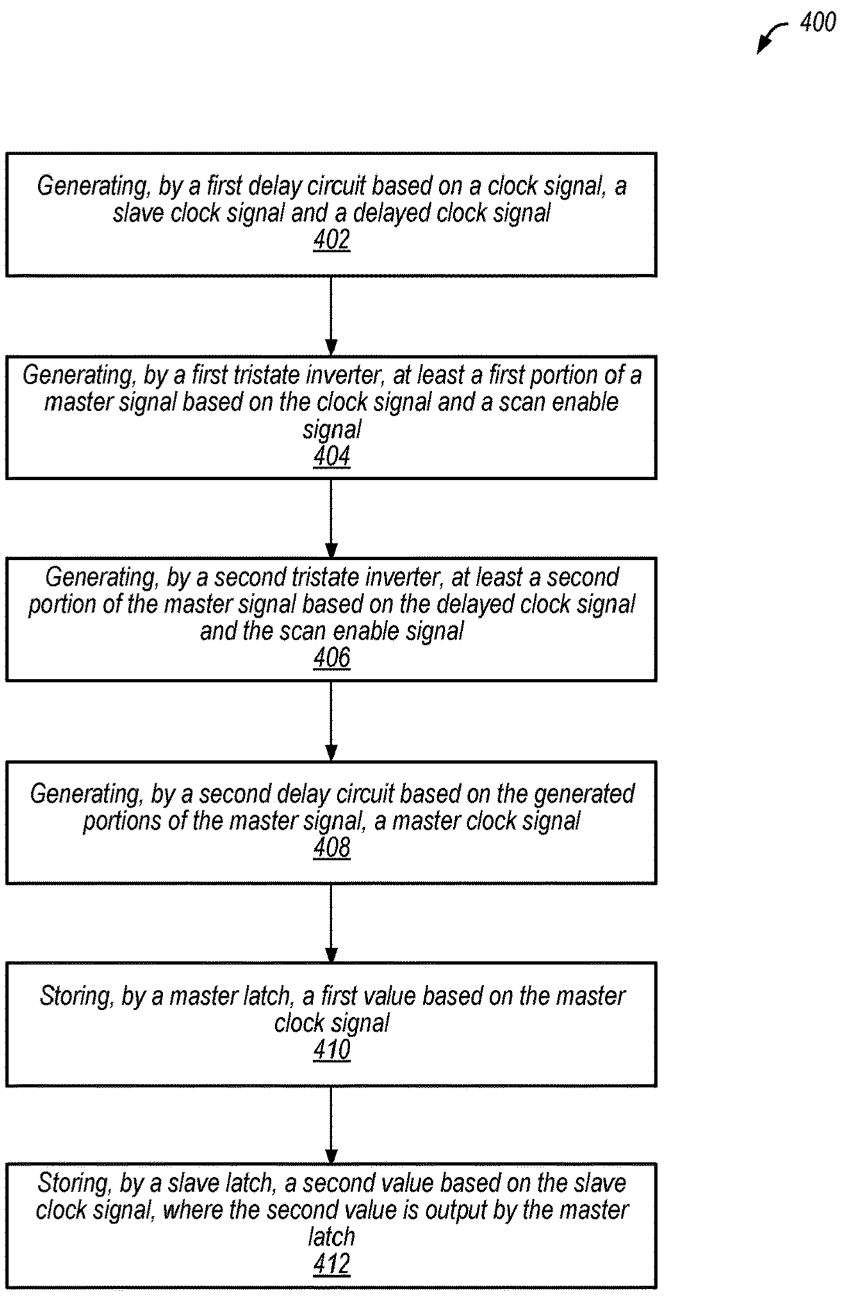
FIG. 4 is a flow diagram illustrating one embodiment of a method of storing a data value.

Referring now to FIG. 4, a flow diagram of a method 400 of storing a data value is depicted. In some embodiments, method 400 may be initiated or performed by one or more processors in response to one or more instructions stored by a computer-readable storage medium.

At 402, method 400 includes generating, by a first delay circuit based on a clock signal, a slave clock signal and a delayed clock signal. For example, delay circuit 102 of FIG. 1 may generate slave clock signal 136 and delayed clock signal 131 based on clock signal 130.

At 404, method 400 includes generating, by a first tristate inverter, at least a first portion of a master signal based on the clock signal and a scan enable signal. For example, tristate inverter 104 may generate at least a first portion of master signal 139 based on clock signal 130 and scan enable signal 132.

At 406, method 400 includes generating, by a second tristate inverter, at least a second portion of the master signal based on the delayed clock signal and the scan enable signal. For example, tristate inverter 106 may generate at least a second portion of master signal 139 based on delayed clock signal 131 and scan enable signal 132.

At 408, method 400 includes generating, by a second delay circuit based on the generated portions of the master signal, a master clock signal. For example, delay circuit 108 may generate master clock signal 140 based on master signal 139.

At 410, method 400 includes storing, by a master latch, a first value based on the master clock signal. For example, master latch 204 of FIG. 2 may store a value of master input signal 236 based on master clock signal 140.

At 412, method 400 includes storing, by a slave latch, a second value based on the slave clock signal. The second value may be output by the master latch. For example, slave latch 206 may store a value of slave input signal 238 based on slave clock signal 136. Accordingly, a method of storing a data value is depicted.

Figure 5:
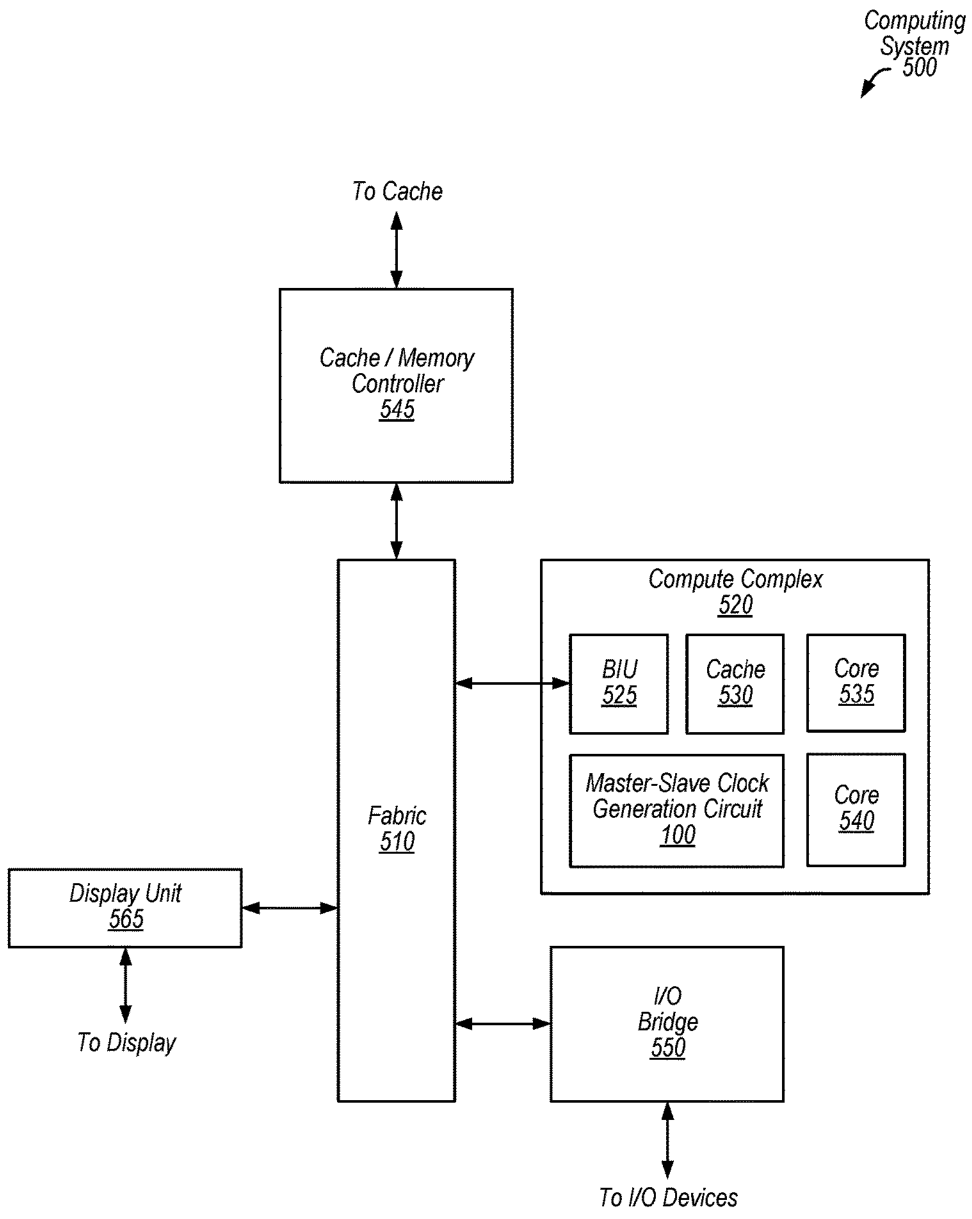
FIG. 5 is block diagram illustrating an embodiment of a computing system that includes at least a portion of a master-slave clock generation circuit.

Turning next to FIG. 5, a block diagram illustrating an exemplary embodiment of a computing system 500 that includes at least a portion of a master-slave clock generation circuit. The computing system 500 includes master-slave clock generation circuit 100 of FIG. 1. In some embodiments, master-slave clock generation circuit 100 includes one or more of the circuits described above with reference to FIG. 1, including any variations or modifications described previously with reference to FIGS. 1-4. In some embodiments, some or all elements of the computing system 500 may be included within a system on a chip (SoC). In some embodiments, computing system 500 is included in a mobile device. Accordingly, in at least some embodiments, area and power consumption of the computing system 500 may be important design considerations. In the illustrated embodiment, the computing system 500 includes fabric 510, compute complex 520, input/output (I/O) bridge 550, cache/memory controller 545, and display unit 565. Although the computing system 500 illustrates master-slave clock generation circuit 100 as being located within compute complex 520, in other embodiments, computing system 500 may include master-slave clock generation circuit 100 in other locations (e.g., connected to or included in cache/memory controller 545) or may include multiple instances of master-slave clock generation circuit 100. The master-slave clock generation circuits 100 may correspond to different embodiments or to the same embodiment.

Fabric 510 may include various interconnects, buses, MUXes, controllers, etc., and may be configured to facilitate communication between various elements of computing system 500. In some embodiments, portions of fabric 510 are configured to implement various different communication protocols. In other embodiments, fabric 510 implements a single communication protocol and elements coupled to fabric 510 may convert from the single communication protocol to other communication protocols internally.

In the illustrated embodiment, compute complex 520 includes bus interface unit (BIU) 525, cache 530, cores 535 and 540, and master-slave clock generation circuit 100. In some embodiments, cache 530, cores 535 and 540, other portions of compute complex 520, or a combination thereof may be hardware resources. In various embodiments, compute complex 520 includes various numbers of cores and/or caches. For example, compute complex 520 may include 1, 2, or 4 processor cores, or any other suitable number. In some embodiments, cores 535 and/or 540 include internal instruction and/or data caches. In some embodiments, a coherency unit (not shown) in fabric 510, cache 530, or elsewhere in computing system 500 is configured to maintain coherency between various caches of computing system 500. BIU 525 may be configured to manage communication between compute complex 520 and other elements of computing system 500. Processor cores such as cores 535 and 540 may be configured to execute instructions of a particular instruction set architecture (ISA), which may include operating system instructions and user application instructions.

Cache/memory controller 545 may be configured to manage transfer of data between fabric 510 and one or more caches and/or memories (e.g., non-transitory computer readable mediums). For example, cache/memory controller 545 may be coupled to an L3 cache, which may, in turn, be coupled to a system memory. In other embodiments, cache/memory controller 545 is directly coupled to a memory. In some embodiments, the cache/memory controller 545 includes one or more internal caches. In some embodiments, the cache/memory controller 545 may include or be coupled to one or more caches and/or memories that include instructions that, when executed by one or more processors (e.g., compute complex 520), cause the processor, processors, or cores to initiate or perform some or all of the processes described above with reference to FIGS. 1-4 or below with reference to FIG. 6. In some embodiments, one or more portions of the caches/memories may correspond to hardware resources.

As used herein, the term "coupled to" may indicate one or more connections between elements, and a coupling may include intervening elements. For example, in FIG. 5, display unit 565 may be described as "coupled to" compute complex 520 through fabric 510. In contrast, in the illustrated embodiment of FIG. 5, display unit 565 is "directly coupled" to fabric 510 because there are no intervening elements.

Display unit 565 may be configured to read data from a frame buffer and provide a stream of pixel values for display. Display unit 565 may be configured as a display pipeline in some embodiments. Additionally, display unit 565 may be configured to blend multiple frames to produce an output frame. Further, display unit 565 may include one or more interfaces (e.g., MIPI® or embedded display port (eDP)) for coupling to a user display (e.g., a touchscreen or an external display). In some embodiments, one or more portions of display unit 565 may be hardware resources.

I/O bridge 550 may include various elements configured to implement: universal serial bus (USB) communications, security, audio, and/or low-power always-on functionality, for example. I/O bridge 550 may also include interfaces such as pulse-width modulation (PWM), general-purpose input/output (GPIO), serial peripheral interface (SPI), and/or inter-integrated circuit (I2C), for example. Various types of peripherals and devices may be coupled to computing system 500 via I/O bridge 550. In some embodiments, master-slave clock generation circuit 100 may be coupled to computing system 500 via I/O bridge 550. In some embodiments, one or more devices coupled to I/O bridge 550 may be hardware resources.

Figure 6:
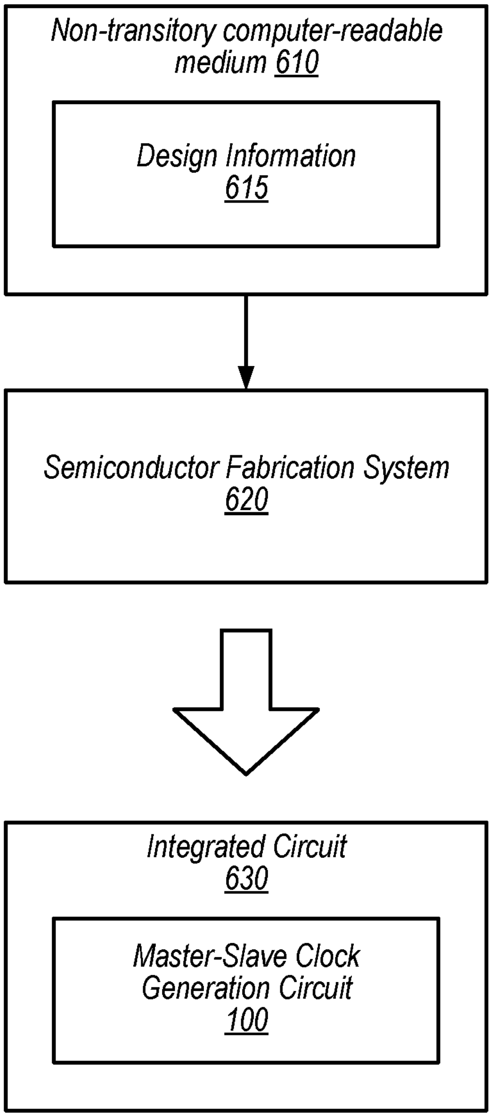
FIG. 6 is a block diagram illustrating one embodiment of a process of fabricating at least a portion of a processing circuit that includes a master-slave clock generation circuit.

FIG. 6 is a block diagram illustrating a process of fabricating at least a portion of a clock generation circuit. FIG. 6 includes a non-transitory computer-readable medium 610 and a semiconductor fabrication system 620. Non-transitory computer-readable medium 610 includes design information 615. FIG. 6 also illustrates a resulting fabricated integrated circuit 630. In the illustrated embodiment, integrated circuit 630 includes master-slave clock generation circuit 100 of FIG. 1. However, in other embodiments, integrated circuit 630 may only include one or more portions of master-slave clock generation circuit 100 (e.g., delay circuit 102). In some embodiments, integrated circuit 630 may include different embodiments of master-slave clock generation circuit 100. In the illustrated embodiment, semiconductor fabrication system 620 is configured to process design information 615 stored on non-transitory computer-readable medium 610 and fabricate integrated circuit 630.

Non-transitory computer-readable medium 610 may include any of various appropriate types of memory devices or storage devices. For example, non-transitory computer-readable medium 610 may include at least one of an installation medium (e.g., a CD-ROM, floppy disks, or tape device), a computer system memory or random access memory (e.g., DRAM, DDR RAM, SRAM, EDO RAM, Rambus RAM, etc.), a non-volatile memory such as a Flash, magnetic media (e.g., a hard drive, or optical storage), registers, or other types of non-transitory memory. Non-transitory computer-readable medium 610 may include two or more memory mediums, which may reside in different locations (e.g., in different computer systems that are connected over a network).

Design information 615 may be specified using any of various appropriate computer languages, including hardware description languages such as, without limitation: VHDL, Verilog, SystemC, SystemVerilog, RHDL, M, MyHDL, etc. Design information 615 may be usable by semiconductor fabrication system 620 to fabricate at least a portion of integrated circuit 630. The format of design information 615 may be recognized by at least one semiconductor fabrication system 620. In some embodiments, design information 615 may also include one or more cell libraries, which specify the synthesis and/or layout of integrated circuit 630. In some embodiments, the design information is specified in whole or in part in the form of a netlist that specifies cell library elements and their connectivity. Design information 615, taken alone, may or may not include sufficient information for fabrication of a corresponding integrated circuit (e.g., integrated circuit 630). For example, design information 615 may specify circuit elements to be fabricated but not their physical layout. In this case, design information 615 may be combined with layout information to fabricate the specified integrated circuit.

Semiconductor fabrication system 620 may include any of various appropriate elements configured to fabricate integrated circuits. This may include, for example, elements for depositing semiconductor materials (e.g., on a wafer, which may include masking), removing materials, altering the shape of deposited materials, modifying materials (e.g., by doping materials or modifying dielectric constants using ultraviolet processing), etc. Semiconductor fabrication system 620 may also be configured to perform various testing of fabricated circuits for correct operation.

In various embodiments, integrated circuit 630 is configured to operate according to a circuit design specified by design information 615, which may include performing any of the functionality described herein. For example, integrated circuit 630 may include any of various elements described with reference to FIGS. 1-5. Further, integrated circuit 630 may be configured to perform various functions described herein in conjunction with other components. The functionality described herein may be performed by multiple connected integrated circuits.

As used herein, a phrase of the form "design information that specifies a design of a circuit configured to . . . " does not imply that the circuit in question must be fabricated in order for the element to be met. Rather, this phrase indicates that the design information describes a circuit that, upon being fabricated, will be configured to perform the indicated actions or will include the specified components.

In some embodiments, a method of initiating fabrication of integrated circuit 630 is performed. Design information 615 may be generated using one or more computer systems and stored in non-transitory computer-readable medium 610. The method may conclude when design information 615 is sent to semiconductor fabrication system 620 or prior to design information 615 being sent to semiconductor fabrication system 620. Accordingly, in some embodiments, the method may not include actions performed by semiconductor fabrication system 620. Design information 615 may be sent to semiconductor fabrication system 620 in a variety of ways. For example, design information 615 may be transmitted (e.g., via a transmission medium such as the Internet) from non-transitory computer-readable medium 610 to semiconductor fabrication system 620 (e.g., directly or indirectly). As another example, non-transitory computer-readable medium 610 may be sent to semiconductor fabrication system 620. In response to the method of initiating fabrication, semiconductor fabrication system 620 may fabricate integrated circuit 630 as discussed above.

Although specific embodiments have been described above, these embodiments are not intended to limit the scope of the present disclosure, even where only a single embodiment is described with respect to a particular feature. Examples of features provided in the disclosure are intended to be illustrative rather than restrictive unless stated otherwise. The above description is intended to cover such alternatives, modifications, and equivalents as would be apparent to a person skilled in the art having the benefit of this disclosure.

The scope of the present disclosure includes any feature or combination of features disclosed herein (either explicitly or implicitly), or any generalization thereof, whether or not it mitigates any or all of the problems addressed herein. Accordingly, new claims may be formulated during prosecution of this application (or an application claiming priority thereto) to any such combination of features. In particular, with reference to the appended claims, features from dependent claims may be combined with those of the independent claims and features from respective independent claims may be combined in any appropriate manner and not merely in the specific combinations enumerated in the appended claims.

What is claimed is:

1. An apparatus, comprising:

a clock generation circuit, comprising:

a first delay circuit configured to receive a clock signal and generate, based on the clock signal, a slave clock signal and a delayed clock signal;

a first tristate inverter configured to generate at least a first portion of a master signal based on the clock signal and a scan enable signal;

a second tristate inverter configured to generate at least a second portion of the master signal based on the delayed clock signal and the scan enable signal, wherein the output of the first tristate inverter is connected to the output of the second tristate inverter; and a second delay circuit configured to generate a master clock signal based on the generated portions of the master signal.

2. The apparatus of claim 1, further comprising a flip-flop circuit, comprising:

a master latch configured to store a first value based on the master clock signal; and a slave latch configured to store a second value based on the slave clock signal.

3. The apparatus of claim 2, wherein the second value is an output of the master latch.

4. The apparatus of claim 2, wherein the flip-flop circuit further comprises a selection circuit configured, based on the scan enable signal, to provide a data signal to the master latch as the first value or to provide a scan signal to the master latch as the first value.

5. The apparatus of claim 2, wherein the flip-flop circuit further comprises a routing circuit configured, based on the scan enable signal, to connect an output of the slave latch to a data output line or a scan output line.

6. The apparatus of claim 2, further comprising a second flip-flop circuit, comprising:

a second master latch configured to store a third value based on the master clock signal; and a second slave latch configured to store a fourth value based on the slave clock signal.

7. The apparatus of claim 6, wherein the third value is an output of the slave latch of the flip-flop circuit.

8. The apparatus of claim 7, further comprising a delay circuit configured to receive the output of the slave latch of the flip-flop circuit and provide a delayed version of the output of the slave latch to the second master latch as the third value.

9. The apparatus of claim 1, wherein the first tristate inverter comprises a pair of transistors configured to connect the second delay circuit to a voltage source when the scan enable signal is asserted and the clock signal is deasserted.

10. The apparatus of claim 1, wherein the first tristate inverter comprises a pair of transistors configured to connect the second delay circuit to a ground voltage when the scan enable signal and the clock signal are both asserted.

11. The apparatus of claim 1, wherein the second tristate inverter comprises a pair of transistors configured to connect the second delay circuit to a voltage source when the scan enable signal and the delayed clock signal are both deasserted.

12. The apparatus of claim 1, wherein the second tristate inverter comprises a pair of transistors configured to connect the second delay circuit to a ground voltage when the scan enable signal is deasserted and the delayed clock signal is asserted.

13. A method, comprising:

generating, by a first delay circuit of a clock generation circuit based on a clock signal, a slave clock signal and a delayed clock signal;

generating, by a first tristate inverter of the clock generation circuit, at least a first portion of a master signal based on the clock signal and a scan enable signal;

generating, by a second tristate inverter of the clock generation circuit, at least a second portion of the master signal based on the delayed clock signal and the scan enable signal;

generating, by a second delay circuit of the clock generation circuit based on the generated portions of the master signal, a master clock signal;

storing, by a master latch, a first value based on the master clock signal; and storing, by a slave latch, a second value based on the slave clock signal, wherein the second value is output by the master latch.

14. The method of claim 13, further comprising:

storing, by a second master latch, a third value based on the master clock signal, wherein the third value is output by the slave latch; and storing, by a second slave latch, a fourth value, wherein the fourth value is output by the second master latch.

15. The method of claim 13, wherein the second delay circuit includes a different number of inverters than the first delay circuit.

16. The method of claim 13, wherein the first delay circuit comprises an even number of inverters.

17. A non-transitory computer readable storage medium having stored thereon design information that specifies a circuit design in a format recognized by a fabrication system that is configured to use the design information to fabricate a hardware integrated circuit that includes:

a master latch configured to store a first value based on a master clock signal and an inverted master clock signal;

a slave latch configured to store a second value based on a slave clock signal and an inverted slave clock signal;

a clock generation circuit, comprising:

a first delay circuit configured to receive a clock signal and generate, based on the clock signal, the slave clock signal, the inverted slave clock signal, and a delayed clock signal;

a first tristate inverter configured to generate at least a first portion of a master signal based on the clock signal and a scan enable signal;

a second tristate inverter configured to generate at least a second portion of the master signal based on the delayed clock signal and the scan enable signal, wherein the output of the first tristate inverter is connected to the output of the second tristate inverter; and a second delay circuit configured to receive the master signal and generate, based on the generated portions of the master signal, the master clock signal and the inverted master clock signal.

18. The non-transitory computer readable storage medium of claim 17, wherein the first delay circuit is further configured to generate the delayed clock signal by inverting the clock signal at least twice.

19. The non-transitory computer readable storage medium of claim 17, wherein the first tristate inverter is configured to generate the at least a first portion of the master signal in response to the scan enable signal being asserted.

20. The non-transitory computer readable storage medium of claim 17, wherein the second tristate inverter is configured to generate the at least a second portion of the master signal in response to the scan enable signal being deasserted.

* * * * *